(12) United States Patent
Herchen

(10) Patent No.: US 6,502,529 B2
(45) Date of Patent: *Jan. 7, 2003

(54) CHAMBER HAVING IMPROVED GAS ENERGIZER AND METHOD

(75) Inventor: Harald Herchen, San Jose, CA (US)

(73) Assignee: Applied Materials Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/321,485

(22) Filed: May 27, 1999

(65) Prior Publication Data

US 2002/0037653 A1 Mar. 28, 2002

(51) Int. Cl.⁷ ............................. C23C 16/00; H05H 1/00
(52) U.S. Cl. ..................... 118/723 ME; 118/723 MW; 118/724; 156/345.36; 156/345.41; 156/345.37
(58) Field of Search ................... 118/723 MW, 118/723 ME, 723 MR, 723 MA, 723 AN, 723 I, 723 IR, 724; 156/345.36, 345.41, 345.37

(56) References Cited

U.S. PATENT DOCUMENTS

| 3,846,798 A | 11/1974 | Carl ............................ 343/705 |
| 4,458,223 A | 7/1984 | Schmidt ...................... 333/252 |
| 4,620,170 A | 10/1986 | Lavering ..................... 333/252 |
| 5,126,635 A | 6/1992 | Doehler et al. .......... 315/111.21 |
| 5,180,436 A | 1/1993 | Ueda et al. ................. 118/723 |
| 5,200,722 A | 4/1993 | Wolf ........................... 333/252 |
| 5,389,153 A | 2/1995 | Paranjpe et al. ....... 118/723 MP |
| 5,509,046 A | 4/1996 | Logan ......................... 378/161 |
| 5,510,151 A * | 4/1996 | Malsuyama et al. ......... 427/509 |
| 5,568,015 A | 10/1996 | Holber et al. .................. 315/39 |
| 5,625,259 A | 4/1997 | Holber et al. ............ 315/111.21 |
| 5,639,341 A * | 6/1997 | Tabara ...................... 156/643.1 |
| 5,716,451 A | 2/1998 | Hama et al. |
| 5,824,607 A * | 10/1998 | Trow et al. .................. 438/732 |
| 5,846,883 A | 12/1998 | Moslehi |
| 5,863,376 A | 1/1999 | Wicker et al. |
| 6,059,922 A * | 5/2000 | Yamazaki et al. ........... 156/345 |
| 6,063,233 A * | 5/2000 | Collins et al. ............... 156/345 |

FOREIGN PATENT DOCUMENTS

| JP | 63-130784 A * | 6/1988 | ............. C23F/4/00 |
| JP | 64-67908 A * | 3/1989 | ......... H01L/21/205 |
| JP | 4-183869 A * | 6/1992 | ........... C23C/16/50 |
| JP | 6-136541 A * | 5/1994 | ........... C23C/16/50 |
| JP | 11-87317 A * | 3/1999 | ....... H01L/21/3065 |

OTHER PUBLICATIONS

U.S. patent application entitled, "Microwave Plasma Based Applicator"; filed Jul. 10, 1995; Ser. No. 08/499,984; Inventors: Herchen, et al.

* cited by examiner

Primary Examiner—Gregory Mills
Assistant Examiner—P. Hassanzadeh
(74) Attorney, Agent, or Firm—Ashok Janah; Joseph Bach (57) ABSTRACT

A chamber 35 for energizing a gas comprises a gas distributor 85 having an aperture 250 for introducing gas into the chamber 35 and a wall 175 comprising boron nitride. The chamber 35 further comprises a gas energizer 90 capable of passing electromagnetic energy through the wall 175 to energize the gas in the chamber 35.

20 Claims, 9 Drawing Sheets

ABER HAVING IMPROVED GAS
ENERGIZER AND METHOD

BACKGROUND

The present invention relates to a chamber having an improved gas energizer.

Gas energized by electromagnetic energy, such as microwave or RF energy, is used to fabricate electronic devices on a substrate. The energized gas deposits or etches dielectric, semiconducting, and conductor materials, for example, silicon dioxide, polysilicon, metals and their suicides or nitrides on the substrate. The gas is energized by electromagnetic energy transported by a waveguide from an electromagnetic source and passed through a window into the chamber. One problem arises because it is difficult to securely attach the waveguide to the window. A secure joint between the waveguide and the window reduces the impedance of the joint to electromagnetic energy and thereby enhances coupling of electromagnetic energy through the joint. However, it is difficult to securely join the waveguide to the window without causing excessive thermal expansion stresses at their interface during processing of the substrate. Because the window is often made from brittle ceramic material, it can crack when subjected to high thermal expansion stresses. Thus it is desirable to have a secure joint between the window and the chamber that is capable of absorbing thermal expansion stresses without failing.

Another problem arises when the window heats up through the absorption of a portion of the electromagnetic energy passing through the window or because of the bombardment of energized gas onto the window. The higher window temperatures can cause the dielectric properties of the window to change and lead to inconsistent processing results. Also, higher temperatures can cause severe thermal expansion stresses at the interface between the window and chamber, which can cause failure of the joint or the window. In one solution, a heat removing device, such as a set of channels having circulating cooling fluid, is positioned abutting the window to remove heat from the window. However, the channels and fluid circulating therethrough absorbs some of the electromagnetic energy transmitted through the channels and reduces the energy coupling efficiency of the apparatus. In another solution, cooling channels are positioned around a conduit through which a as is passed for energizing the gas, and the electromagnetic energy is directed through the gaps between the channels. However, this solution also limits the electromagnetic energy that can be coupled to the gas by the size and spacing of the gaps between the channels.

Therefore there is a need for a chamber and gas energizer system that is capable of efficiently coupling electromagnetic energy to energize a gas for processing a substrate. It is also desirable to limit heating of the gas energizing components, such as the window, and to remove heat generated in the window. It is further desirable to have a chamber with a window that can withstand thermal and mechanical stresses and that can maintain a secure joint with the chamber. It is also desirable to remove the heat generated in the window to a remote location.

SUMMARY

In one aspect, the present invention relates to a chamber capable of processing a substrate, the chamber comprising a gas distributor having an aperture through which gas may be introduced into the chamber; a wall comprising boron nitride; and a gas energizer capable of passing electromagnetic energy through the wall to energize the gas in the chamber.

In another version, the chamber comprises a gas distributor having an aperture through which gas may be introduced into the chamber; a window having a fin extending outwardly therefrom to dissipate heat from the window; and a gas energizer capable of passing electromagnetic energy through the window to energize the gas in the chamber.

In yet another version, the chamber comprises a conduit having a window comprising boron nitride, a gas energizer capable of coupling electromagnetic energy through the window to a gas in the conduit thereby generating heat in the window, and a heat sink abutting the window to remove the heat to a remote location.

In still another version, the chamber comprises a conduit comprising a as distributor having an aperture for directing a gas stream against a wall of the conduit; and a gas energizer capable of energizing the gas in the conduit.

In another version, the chamber comprises a conduit having a gas distributor through which gas may be introduced into the conduit, the gas distributor being bonded to the conduit; and a gas energizer to energize the gas in the conduit.

In another version, the chamber comprises a conduit having a passage adapted to pass gas therethrough, and a wall adjacent to the passage; a gas energizer capable of coupling energy through the wall to energize the gas in the passage; and a magnetic field generator adapted to provide a magnetic field across a portion of the wall of the conduit.

In another version, the chamber comprises a conduit through which a gas may be passed; a source of electromagnetic waves and a waveguide for transmitting the electromagnetic waves; and a surface wave generator to couple the electromagnetic waves transmitted by the waveguide to the gas in the conduit, the surface wave generator comprising one or more conductors and a movable member.

In another version, the chamber comprises a conduit through which a gas may be passed; a source of electromagnetic waves; and a waveguide adapted to transmit electromagnetic waves from the source to a surface wave generator that couples the electromagnetic waves to the gas in the conduit, the surface wave generator comprising a pair of concentric conductors, at least one conductor comprising channels through which a heat transfer fluid may be circulated.

In another version, the present invention comprises a process chamber comprising a conduit through which a gas may be passed, the conduit terminating in a gas expansion chamber having a cross-sectional area that is larger than a cross-sectional area of the conduit; and a gas energizer capable of coupling electromagnetic energy to the gas in the conduit to energize the gas.

In another aspect, the present invention comprises a method of processing a substrate in an energized gas, the method comprising the steps of energizing a gas by coupling electromagnetic energy to the gas through a window comprising boron nitride and removing the heat from the window to a remote location.

In another version, the method comprises the steps of introducing gas into a chamber; energizing the gas by coupling electromagnetic energy through a window of the chamber, whereby the window rises in temperature; and maintaining a thermal conductor in contact with the window to conduct heat away from the window.

In another version, the method comprises the steps of injecting a gas stream into a conduit at an angle relative to an axis of the conduit; and energizing the gas to process the substrate.

In another version, the method is useful for energizing a gas for processing of a substrate, and the method comprises the steps of flowing a gas through a passage of a conduit having a window; passing electromagnetic energy through the window to form an energized gas in the passage; and maintaining a magnetic field across the window to reduce impingement of the energized gas on the window.

DRAWINGS

These features, aspects, and advantages of the present invention will become better understood with regard to the following description, appended claims, and accompanying drawings which illustrate examples of the invention, where:

FIG. 11b is a schematic sectional top view of the conduit of FIG. 11a; and

DESCRIPTION

Figure 1:
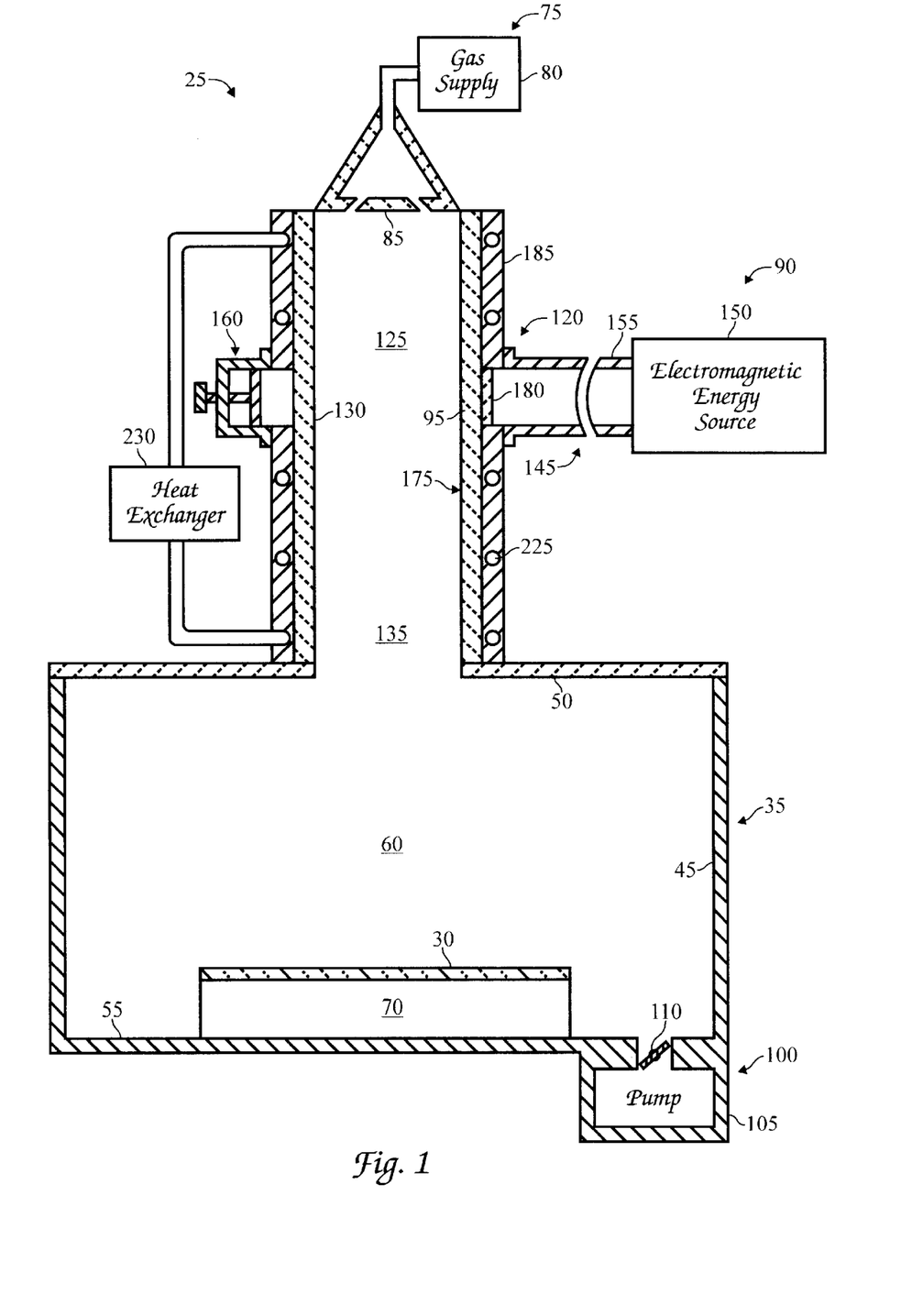
FIG. 1 is a schematic sectional view of a chamber according to the present invention.

An apparatus 25 for processing a substrate 30, such as a semiconductor wafer in an energized gas or plasma, comprises a chamber 35 having sidewalls 45, a top wall 50, and a bottom wall 55 enclosing a process zone 60. A support 70 for supporting the substrate 30 in the process zone 60 rests on the bottom wall 55. Gas is introduced into the chamber 35 through a gas distribution system 75 comprising a as supply 80 and a gas distributor 85. A gas energizer 90 passes electromagnetic energy , such as microwave or RF energy, through a window 95 to energize the gas to process the substrate 30. Spent gas and byproducts are exhausted from the chamber 35 through an exhaust system 100 which typically includes a vacuum pump 105 and a throttle valve 110 to control the pressure of gas of gas in the chamber 35.

The gas can be energized in the process zone 60 (not shown) or in a remote zone 125 that adjoins the process zone 60, as illustrated in FIG. 1. When the gas is energized in the process zone 60, the energized gas processes the substrate 30 without traveling a long distance to reach the substrate 30, and consequently, the energized gas species generally have higher levels of kinetic energy or dissociation. When the gas is energized in a remote zone 125, the energized gas has a higher ratio of non-energized or non-dissociated species because it has to travel along the distance between the remote zone 125 and process zone 60 to reach the substrate 30. By "remote" it is meant that the center of the remote zone 125 is upstream from the center of the process zone 60. The separation of the remote zone 125 from the process zone 60 allows some recombination of dissociated species during their travel from the remote zone 125 to the process zone 60. Typically, the remote zone 125 is at a distance of at least about 50 mm upstream from the process zone 60. In the version shown in FIG. 1, the remote zone 125 is within a conduit 130 having a passage 135 through which gas may be passed. The passage 135 is preferably a tubular configuration that causes the gas to flow therethrough in generally a single direction parallel to the axis of the passage.

The gas energizer 90 of the apparatus 25 comprises an energy applicator 145 which transmits and couples electromagnetic energy from a source 150 to the gas to energize and activate the gas. In FIG. 1, the energy applicator 145 comprises a waveguide 155 that is adapted to transmit electromagnetic energy or waves at a frequency corresponding to the operating frequency of the source 150. The energy applicator 145 can further include a tuning stub 160, which is a short segment of waveguide 155 that is closed on one end by a plunger 170 and is positioned opposite the waveguide 155. The plunger 170 is used to alter the axial length of a cavity defined by the tuning stub 160, thereby varying the point at which the electromagnetic energy is concentrated in the remote zone 125.

The electromagnetic energy for energizing the gas is coupled to the gas in the remote zone 125 through a window 95 which is substantially transparent to the electromagnetic energy, and maintains the vacuum integrity of the chamber. By "transparent" it is meant a window 95 that has an electromagnetic energy dissipation factor that is sufficiently small to allow either microwave or RF energy to pass through the window 95 with an attenuation of less than about 10%. The window 95 is made from a material that is resistant to erosion from the energized gas, is gas impermeable, and has a sufficient strength to withstand atmospheric pressures while the chamber 35 is operated at a vacuum. The window 95 is made from a ceramic such as quartz (silicon dioxide), aluminum nitride, boron nitride, aluminum oxide, sapphire, or mixtures thereof. Preferably, the window 95 comprises sapphire which is a monocrystalline alumina oxide that exhibits a high degree of resistance to erosive gaseous environments. By "monocrystalline" it is meant a single crystal material or one that comprises a few (typically 10 or fewer) large ceramic crystals that are oriented in the same crystallographic direction, i.e., having crystallographic planes with Miller indices that are aligned to one another.

The electromagnetic energy for energizing the gas is coupled to the gas through the window 95 of the apparatus 25, such as a wall 175 of the conduit 130 (as shown) or a wall 45 of the chamber 35 (not shown). The window 95 is shaped and sized to correspond to the shape and size of the energy applicator 145 to enhance coupling of electromagnetic energy from the source 150 to the gas. Electromagnetic waves are transverse waves, i.e., the direction of the magnetic and electric fields lies at right angles to each other. They can be transmitted or propagated along the waveguide 155 in one of several orientations, including propagation with their electric fields oriented substantially parallel to the surface of the window 95 or with their electric fields oriented substantially perpendicular to a plane of the window 95.

Figure 2:
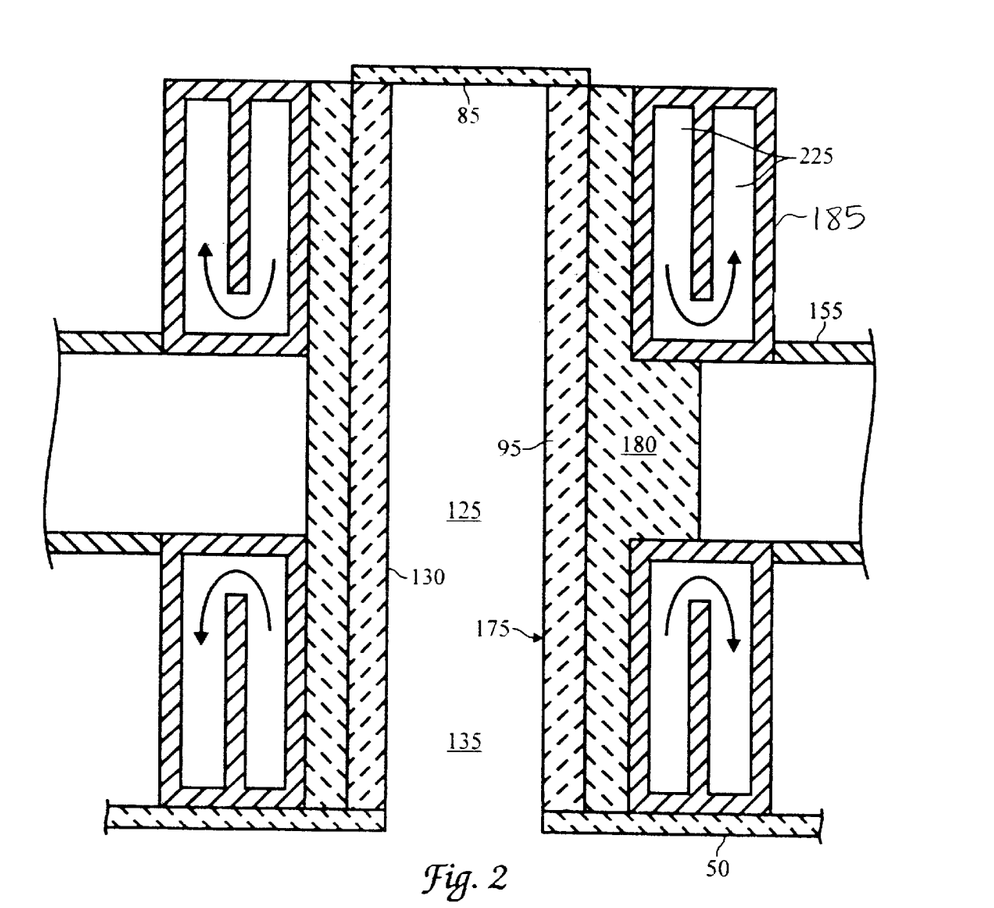
FIG. 2 is a schematic partial sectional side view of another version of a chamber according to the present invention.

In the version illustrated in FIG. 2, the entire conduit 130 is made of a dielectric material that is transparent to electromagnetic energy, and the window 95 is formed by a portion of the wall 175 of the conduit 130. This enables the conduit 130 to be used with many different types of gas energizers 90 and enables the energy applicator 145 to be positioned along the conduit 130 to change the distance of the remote zone 125 from the process zone 60, which in turn controls the ratio of energized to non-energized species in the energized gas. More preferably, the conduit 130 comprises one or more layers of ceramic materials such as quartz (silicon dioxide), aluminum nitride, boron nitride, aluminum oxide, and sapphire. The portion of the conduit 130 that is in contact with the energized gas comprises sapphire which exhibits a high degree of resistance to erosive gaseous environments.

As shown in FIG. 2, preferably the apparatus 25 comprises a heat dissipating assembly 120 that removes heat generated in the window 95 by the transmission of electromagnetic waves through the window 95. The heat dissipating assembly 120 comprises a thermal conductor 180 in thermal contact with the outer surface of the window 95 and with a heat sink 185. The thermal conductor 180 transfers heat from the window 95 to the heat sink 185 substantially without attenuating the electromagnetic energy coupled through the window 95. As for example, shown in FIG. 2, the heat sink may also be substantially out of the path of the microwave energy. The thermal conductor 180 is shaped and sized to conform to and uniformly contact the outer surface of the conduit 130. In this version, the thermal conductor 180 serves to cool not only the window 95 through which electromagnetic energy is transmitted, but also to cool substantially the entire conduit 130. When the conduit 130 is cylindrical, the thermal conductor 180 comprises a conformal and concentric cylinder having a diameter slightly greater than that of the conduit 130 to substantially cover the outer surface of the conduit 130.

The thermal conductor 180 is composed of a material that is substantially transparent to electromagnetic energy, has a high thermal conductivity, and is able to withstand the high operating temperatures of the processing environment. Preferably, the material used for the thermal conductor 180 comprises a thermal conductivity of at least about 80 W/mK, and more preferably at least about 120 W/mK. Typically, the thermal conductor 180 comprises a dissipation factor for absorbing RF or microwave energy of less than about 10%. Because the thermal conductor 180 is isolated from the energized gas by the window 95, it need not be resistant to erosive gaseous environments. Suitable materials for the thermal conductor 180 include, for example, aluminum nitride or boron nitride.

Preferably, the thermal conductor 180 is made from boron nitride which is nontoxic, has a high thermal conductivity, and has a low coefficient of absorption of microwave and RF electromagnetic energy. Two types of boron nitrides which are particularly suited for use in the thermal conductor 180 are hot pressed boron nitride and pyrolytic boron nitride (PBN). The hot pressed boron nitride is formed by applying high pressure to a boron nitride powder at a temperature just below its melting point. Hot pressed boron nitride is relatively inexpensive as compared to pyrolytic boron nitride. However, hot pressed boron nitride often contains trace impurities and interstitial voids and, as a result, has a lower thermal conductivity than pyrolytic boron nitride. Suitable pressure forming apparatuses for applying a pressure on the boron nitride powder to form hot pressed boron nitride include a platen press and an isostatic press.

The pyrolytic boron nitride is synthesized from a vapor by a high temperature and low pressure CVD process, is very pure and consequently has a higher thermal conductivity of about 120 W/mK. Pyrolytic boron nitride also has more anisotropic thermal conductivity than hot pressed boron nitride. By "anisotropic thermal conductivity" it is meant that the material conducts heat much more readily in one direction than in another direction. This is particularly useful in certain versions of the thermal conductor 180 to enhance the transfer of heat from the window 95 to the heat sink 185. In these applications, the thermal conductor 180 is directionally oriented to maximize heat transfer away form the window 95. A further advantage of pyrolytic boron nitride is that it can be conformably deposited onto complex shaped or curved surfaces to form compound, arcuate or other irregular shapes including plates, wafers, rods, and tubes, making it much more versatile than hot pressed boron nitride. Also, pyrolytic boron nitride has a higher mechanical strength than hot pressed boron nitride.

Figure 3:
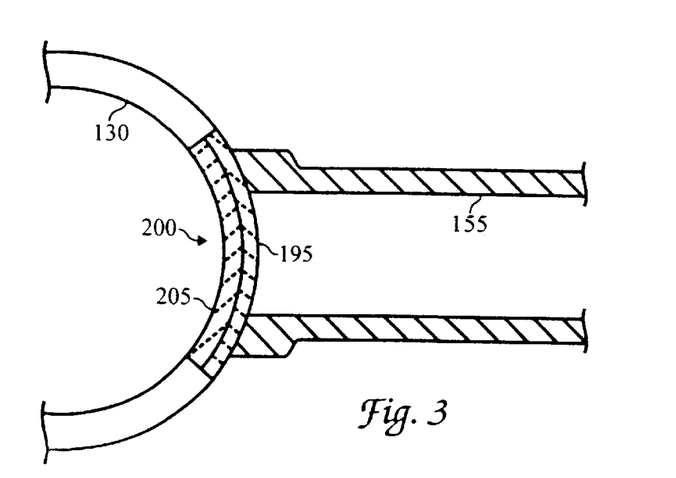
FIG. 3 is a schematic partial sectional top view of another version of the chamber comprising a multilayer window.

As shown in FIG. 3, the thermal conductor 180 can comprise a thermal conductor layer 195 which is bonded to an erosion-resistant layer 205 to define a multilayer window 200. The multilayer window 200 is advantageous for processes in which an erosive or chemically reactive gas is used to process the substrate 30, such as halogen-containing gases. Both the erosion-resistant layer 205 and the thermal conductor layer 195 are composed of a material that is substantially transparent to electromagnetic energy. The erosion-resistant layer 205 is made from a ceramic such as quartz (silicon dioxide), aluminum nitride, boron nitride, aluminum oxide, sapphire, or mixtures thereof. Preferably, the portion of the erosion-resistant layer 205 that is in contact with the energized gas comprises sapphire, which exhibits a high degree of resistance to erosive gaseous environments.

Figure 4:
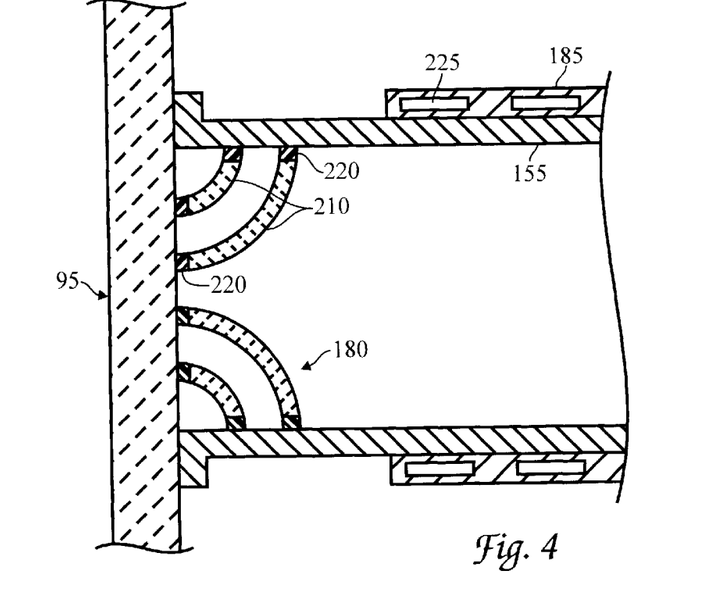
FIG. 4 is a schematic sectional side view of another version of the chamber comprising a window, fins, and a heat sink.

In another version, as shown in FIG. 4, the thermal conductor 180 can comprise a plurality of fins 210 that remove heat from the window 95 by conducting the heat anisotropically along their length to the heat sink 185. By "fin" it is meant a member that extends outwardly from the window 95, such as a member that is transversely oriented to the plane of the window. The fins 210 increase the area of the thermal conductor 180 in contact with the heat sink 185, thereby increasing the rate at which heat can be removed from the window 95. The number and shape of the fins 210 depend on the size of the window 95 and the maximum rate at which heat is produced. A large number of fins 210 maximize heat conduction away from the window 95. It has been found that a preferred number of fins 210 is from about 20 to about 100, each having a thickness of from about 1 to about 5 mm.

Preferably, the thermal conductor 180 comprises a plurality of curved fins 210. The curved fins 210 minimize the thickness of thermal conductor 180 in the path of the electromagnetic energy, especially when the electromagnetic energy is propagated in a direction perpendicular to the surface of the window 95. The curved fins 210 comprise arcuate shapes that thermally couple the window 95 to an inner surface of the waveguide 155 which serves as the heat sink 185. To simplify fabrication of the fins 210 and assembly of the thermal conductor 180, each curved fin 320 can form a portion of a plurality of concentric cylinders (not shown). To provide a more uniform temperature across the window 95, it may be desirable to provide thinner fins 210 near the edges of the window 95 where it is likely to be cooler due to the thermal conductance of the adjoining waveguide 155. Conversely, it may be advantageous in certain low power applications to provide thinner fins 210 near the center of the window 95 to further minimize any attenuation of the electromagnetic energy.

Preferably, the thermal conductor 180 is thermally coupled to the window 95 by a compliant layer 220. The compliant layer 220 fills microscopic gaps between the thermal conductor 180 and the window 95 to enhance heat conduction and is sufficiently compliant to absorb thermal stresses between the window 95 and thermal conductor 180. The compliant layer 220 has a high thermal conductivity, is resistant to damage by high temperatures and electromagnetic energy, and is substantially transparent to electromagnetic energy. The compliant layer 220 comprises particles of a thermally conducting material, such as boron nitride particles, suspended in a polymer matrix, such as a silicone, epoxy, or polymer paste. Suitable materials include, for example, T-putty® or T-pli®, both of which are commercially available from Thermagon, Inc. Optionally, the compliant layer 220 can also comprise an adhesive to bond the thermal conductor 180 to the window 95.

The heat sink 185 of the heat dissipating assembly 120 is either abutting or adjacent to the window 95 and has channels 225 through which the heat transfer fluid is circulated. Heat transfer fluid is circulated through the heat sink 185 by a heat exchanger 230 which removes the heat to a remote location where it is dissipated, for example, by passing the heat transfer fluid through channels in a radiator (not shown) over which air is circulated. In one version, the heat sink 185 surrounds and conforms to the surface of the conduit 130 and the thermal conductor 180 to remove heat from both the window 95 and the conduit 130. The heat sink 185 comprises a U-shaped member abutting the window 95. In addition, the heat sink 185 also serves as a clamp to hold the thermal conductor 180 around the conduit 130. Generally, the heat sink 185 and the waveguide 155 are made of an electrically conducting material and are electrically grounded. When the heat sink 185 is not electrically grounded, electrical charges can accumulate in the window 95, the thermal conductor 180, or the conduit 130 and attract charged particles in the energized gas to causing sputtering and erosion of these components. When the heat sink 185 is electrically grounded, it prevents the accumulation of electrical charges, thereby reducing the erosion by sputtering of the components. Preferably, the heat sink 185 is also bonded to the window 95 by a compliant layer 220 as described above to further enhance thermal coupling between the heat sink 185 and the window 95.

Figure 5:
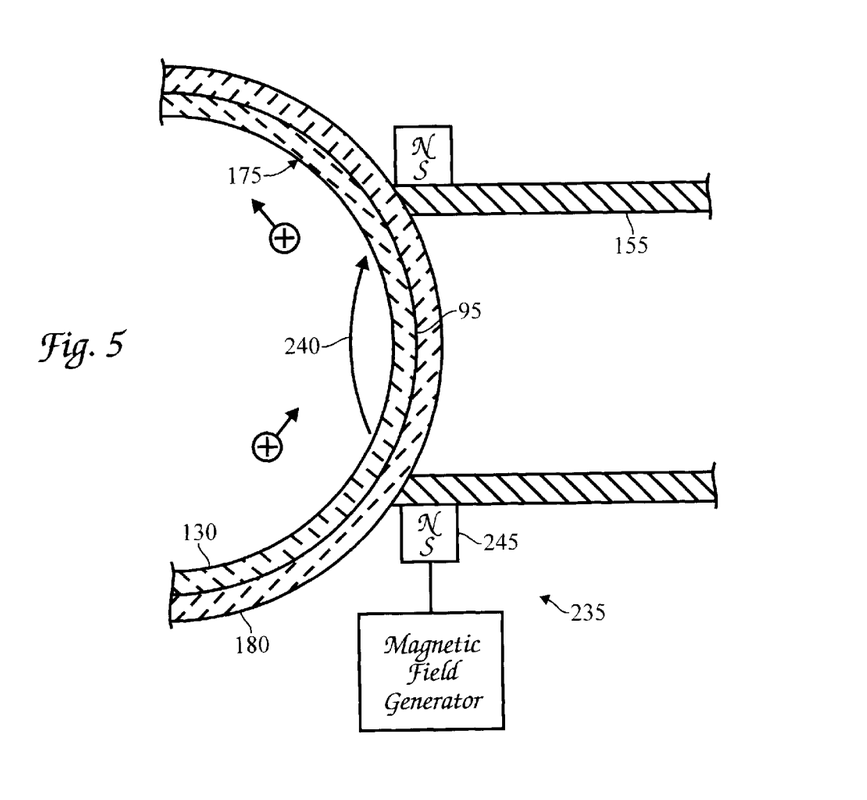
FIG. 5 is a schematic top view of another version of the chamber comprising a magnetic field generator.

In another aspect, as illustrated in FIG. 5, the present invention comprises a magnetic field generator 235 that provides a magnetic field across a portion of the conduit 130 to reduce the impingement and bombardment of the charged species on the conduit 130 to reduce erosion and sputtering of the conduit 130. The magnetic field generator 235 provides a magnetic flux having magnetic field lines that are substantially parallel to the portion of the wall of the conduit 130. Generally, the magnetic field generator 235 provides a magnetic field 240 across the window 95 in the wall of the conduit 130. The magnetic field generator 235 comprises one or more magnets, such as permanent magnets or electromagnets, positioned adjacent to the window 95, the magnets having their magnetic axes substantially parallel to a surface of the window 95. For example, in the version shown in FIG. 5, the magnetic field generator 235 comprises electromagnets 245 positioned at the intersection of the energy applicator 145 abutting the thermal conductor 180. The electromagnets 245 are oriented so that their magnetic axes through their north and south poles are substantially parallel to the plane of the window 95. The magnetic field is high around the space around the inner surface of the conduit 130. The magnetic field generator 235 comprises a strength sufficiently high to cause charged ions and electrons entering this region of magnetic field 240 to rotate in a circular motion at a some fixed average distance away from the inner surface of the conduit 130, thereby reducing the kinetic energy of the species bombarding the window 95. Preferably, the magnetic field generator 235 provides a magnetic field having a field strength that is sufficiently high to substantially repel the charged ions and electrons and prevent from entering this region. It has been discovered that a suitable magnetic field strength is from about 10 to about 10,000 Gauss, and more preferably from about 50 to about 2000 Gauss.

Figure 6A:
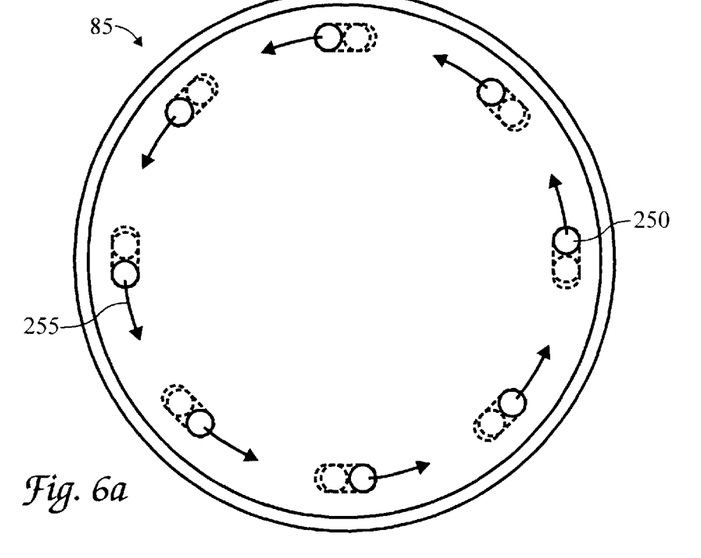
FIG. 6a is a schematic top view of a conduit and gas distributor according to the present invention.
Figure 6B:
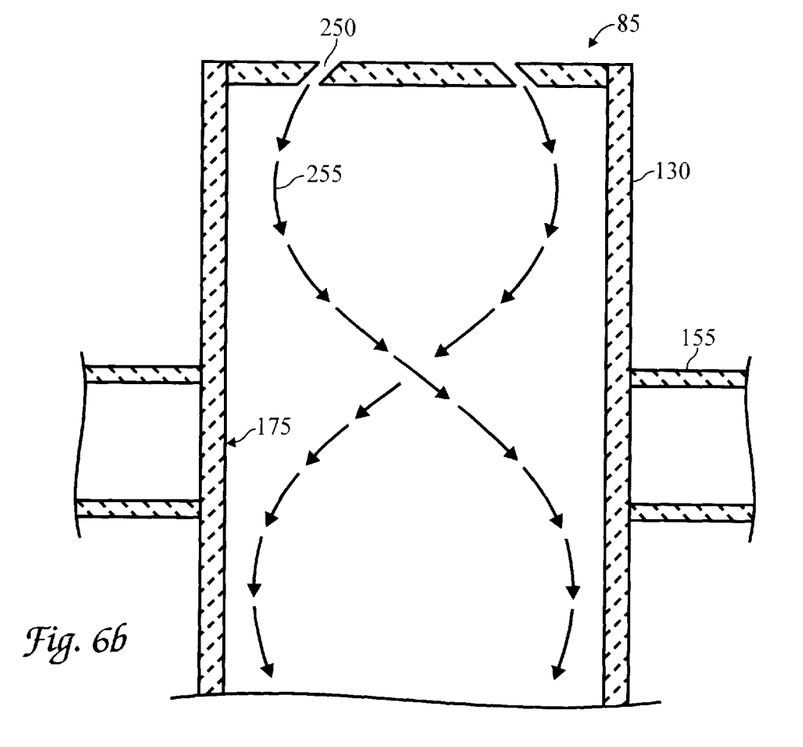
FIG. 6b is a schematic side view of the conduit of FIG. 6a showing a spiraling gas flow path through the conduit.

In another aspect of the present invention, as shown in FIGS. 6a and 6b, the gas distributor 85 comprises one or more apertures 250 through which gas may be introduced into the conduit 130. The apertures 250 are oriented to direct a stream of gas against a surface of the conduit 130, such as the internal wall 175, to increase the resident time of the gas in the passage 135 of the conduit 130. Preferably, the apertures 250 are shaped and distributed to direct the stream of gas in a non-linear flow path 255 through the passage 135. By "non-linear" it is meant that the gas does not flow in a straight line from the inlet to the outlet of the conduit 130 but changes direction one or more times as it flows through the passage 135. A non-linear flow path 255 is desirable to increase the time that the gas is resident in the remote zone 125. This provides a higher degree of dissociation or activation of the gas in the conduit 130. In addition, dissociation or activation of the gas is further increased because the gas distributor 85 also provides a more uniform distribution of gas across the surface of the window 95. Preferably, the apertures 250 are shaped or distributed to direct the stream of gas such that the resident time of the gas in the passage 135 is higher than the resident time of a stream of gas having a substantially linear flow path through the passage 135. More preferably, the apertures 250 are shaped and distributed to direct the gas in a flow path that provides a resident time of at least about 100 microseconds.

Generally, as shown in FIG. 6b, when the conduit 130 comprises a cylindrical shape, the apertures 250 are oriented to direct a stream of gas into the conduit 130 in a flow path having circular component. In this version, each aperture 250 comprises an axis that is at an inclined angle of from about −45 to about 45° relative to a central axis of the passage 135 in the conduit 130. It has been discovered that at these angles, the apertures 250 provide gas streams that form a flow path having substantially circular or spiraling portions 255 through the passage 135 of the conduit 130. The circular or spiraling portions are non-linear relative to the axis of the conduit 130, and because the gas travels in the circular path, it has a longer resident time through the conduit 130 than if the gas were traveling in straight line path that extends directly through the entire conduit 130.

The gas distributor 85 is made from a material that is capable of withstanding erosion by the energized gas and is shaped and sized to conform to the inner dimensions of the conduit 130. The gas distributor 85 is joined to the conduit 130 by clamps, adhesive, or by mating threaded regions at the edge of the gas distributor 85 and the wall 175 of the conduit 130. Preferably, the gas distributor 85 is made of monocrystalline sapphire and is diffusion bonded to the wall 175 of the conduit 130. In the diffusion bonding process, the faces of the crystalline structures to be joined are cleaned, polished, and contacted against one another. Next, an oxygen gettering material is exposed to the joined crystalline structures, and the joint is maintained at a sufficiently high pressure and temperature to cause the crystalline structures to fuse together. The maximum temperature for forming the bond is within the range of physical and crystallographic stability of the materials to be bonded. The resultant diffusion bond withstands erosion by the energized gas, high temperature, and is particularly suitable for applications subjected to high thermal shock levels. In addition, the diffusion bond reduces contamination of the chamber 35 by materials, such as adhesives, that are susceptible to thermal degradation or erosion, and often generates particles that contaminate the chamber 35.

Figure 7:
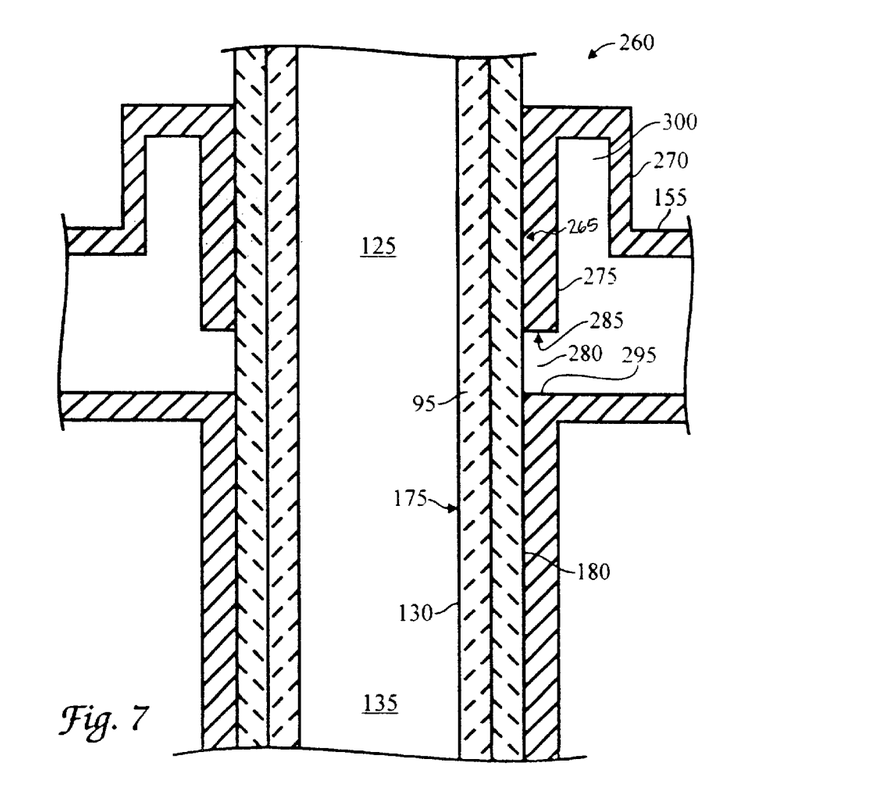
FIG. 7 is a schematic sectional side view of a chamber having a waveguide with a surface wave generator.

In another aspect of the present invention, the energy applicator 145 comprises a surface wave generator 260 coupled to the waveguide 155 to enhance coupling of electromagnetic energy from the waveguide 155 through the conduit 130 to energize the gas in the passage 135 of the conduit 130. Referring to FIG. 7, the surface wave generator 260 comprises conductors 275, 270 that are preferably concentric to one another. The inner conductor 275 comprises a smaller cylinder abutting the conduit 130, and the outer conductor 270 comprises a larger cylinder surrounding and spaced apart from the inner conductor 275. Generally, the inner conductor 275 conforms to an external surface 265 of the conduit 130. In operation, electromagnetic waves from the source 150 are propagated down the length of the waveguide 155 to the inner conductor 275. The electromagnetic waves induce an electrical current in the inner conductor 275 which generates electric and magnetic fields that form surface waves between the inner and outer conductors 270, 275. These surface waves are transmitted along the length of the surface wave generator 260 and into the remote zone 125 in the conduit 130. As illustrated in FIG. 7, electromagnetic energy is transmitted into the conduit 130 through a gap 280 between a tip 285 of the inner conductor 275 and an extension 295 of a surface of the waveguide 155. The dimensions of the gap 280 are selected to enhance the transfer of electromagnetic energy into the conduit 130 and depend on the wavelength and power level of the transmitted electromagnetic energy. If the distance between the tip 285 of the inner conductor 275 and the surface of the waveguide 155 is too small, arcing can occur in the gap 280 to damage the energy applicator 145. If height of the gap 280 is too large, insufficient electromagnetic energy is coupled to the inner conductor 275. The width of the gap 280 can be as large as the outer conductor 270 or the waveguide and is typically at least as great as that of the window 95. For example, when the electromagnetic energy comprises microwaves having a frequency of about 2.45 GHz and at a power level of about 1.5 kW, the gap 280 preferably comprises a rectangle having a height of about 0.2 cm and a width of about 4 cm. One advantage of surface wave generators 260 is that the electromagnetic energy is coupled to a smaller region in the remote zone 125. This focusing of electromagnetic energy increases the probability that a gas molecule entering this region will be energized. This reduces the dispersion of low level energy to other regions within the conduit 130 and improves the energy coupling efficiency of the gas energizer 90. Also, because the gas is energized in only one small region of the conduit 130, the rest of the conduit 130 generally operates at lower temperatures, which reduces thermal stresses and heat dissipation problems.

The transfer of energy into the conduit 130 can be further improved by selecting the size of the inner and outer conductors 270, 275 to "tune" the surface wave generator 260. As shown in FIG. 7, the inner and outer conductors 270, 275 define a resonant cavity 300 having a dimension selected to enhance coupling of the electromagnetic waves to the gas in the passage of the conduit 130. The resonant cavity 300 generates a reflected wave that constructively interferes with the electromagnetic waves reaching the gap 280 from the waveguide 155 to increase the amplitude of the oscillating electromagnetic waves in the gap 280. Preferably, the depth of the resonant cavity 300 is an integer multiple of a ¼ wavelength of the frequency of electromagnetic energy transmitted. For example, when the electromagnetic energy comprises microwaves having a frequency of about 2.45 GHz, the resonant cavity 300 preferably comprises a depth of from about 0.2 to about 4.0 cm.

Figure 8:
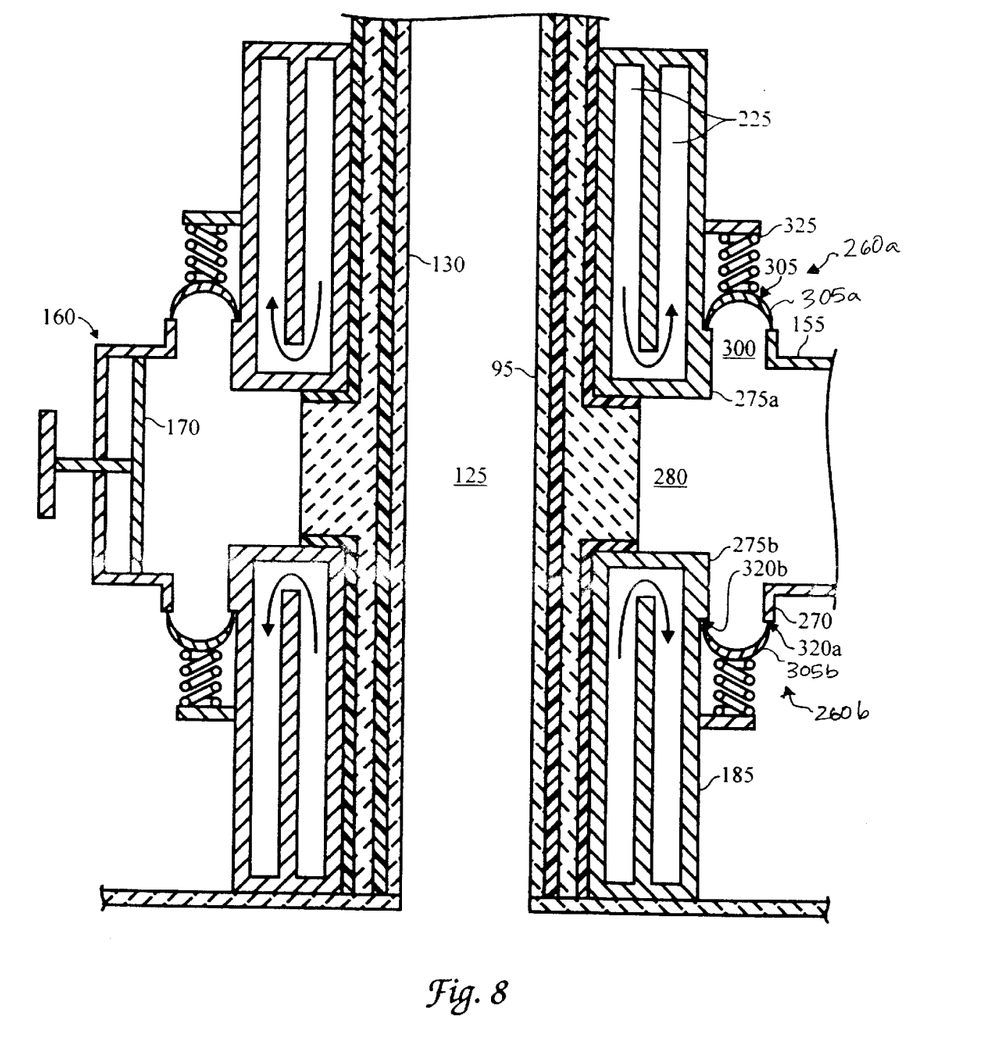
FIG. 8 is a schematic partial sectional side view of a chamber comprising a pair of surface wave generators.

In one version, shown in FIG. 8, the energy applicator 145 comprises two symmetrical surface wave generators 260a,b that intersect a single waveguide 155. A common outer conductor 270 encircles inner conductors 275a,b that abut or are adjacent to the conduit 130. Preferably, the inner conductors 275a,b comprise channels through which a heat transfer fluid is circulated to serve as a heat sink 185. More preferably, the inner conductors 275a,b and the outer conductor 270 are electrically connected by movable members 305a,b that allow some movement of the waveguide 155 relative to the inner conductors 275a,b and the conduit 130. The movable members 305a,b reduce mechanical stresses on the conduit 130 that can arise from joining the surface wave generator 260 and the waveguide 155 to the fragile conduit 130. In addition, the movable members 305a, 305b provide some tolerance in joining the waveguide 155 to the conduit 130 during manufacture of the apparatus 25. Each movable member 305 comprises movable electrical contacts 320a,b that electrical contact the inner conductor 275 on one end and the outer conductor 270 at their other end. A spring 325 is used to maintain the movable member 305 in continuous electrical contact with the concentric inner and outer conductors 270, 275. The spring 325 can comprise a leaf spring (not shown) or a coil spring (as shown) and is preferably made of steel, tungsten, or beryllium.

Figure 9:
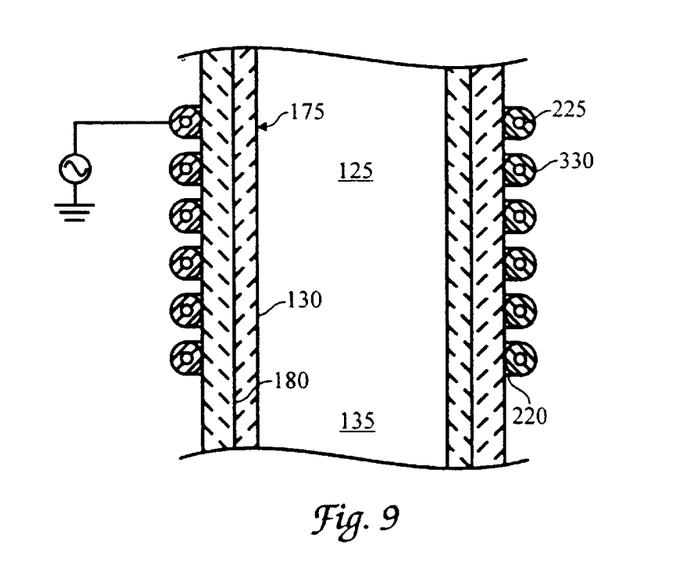
FIG. 9 is a schematic partial sectional side view of a chamber having a gas energizer comprising a cylindrical inductor coil.
Figure 10:
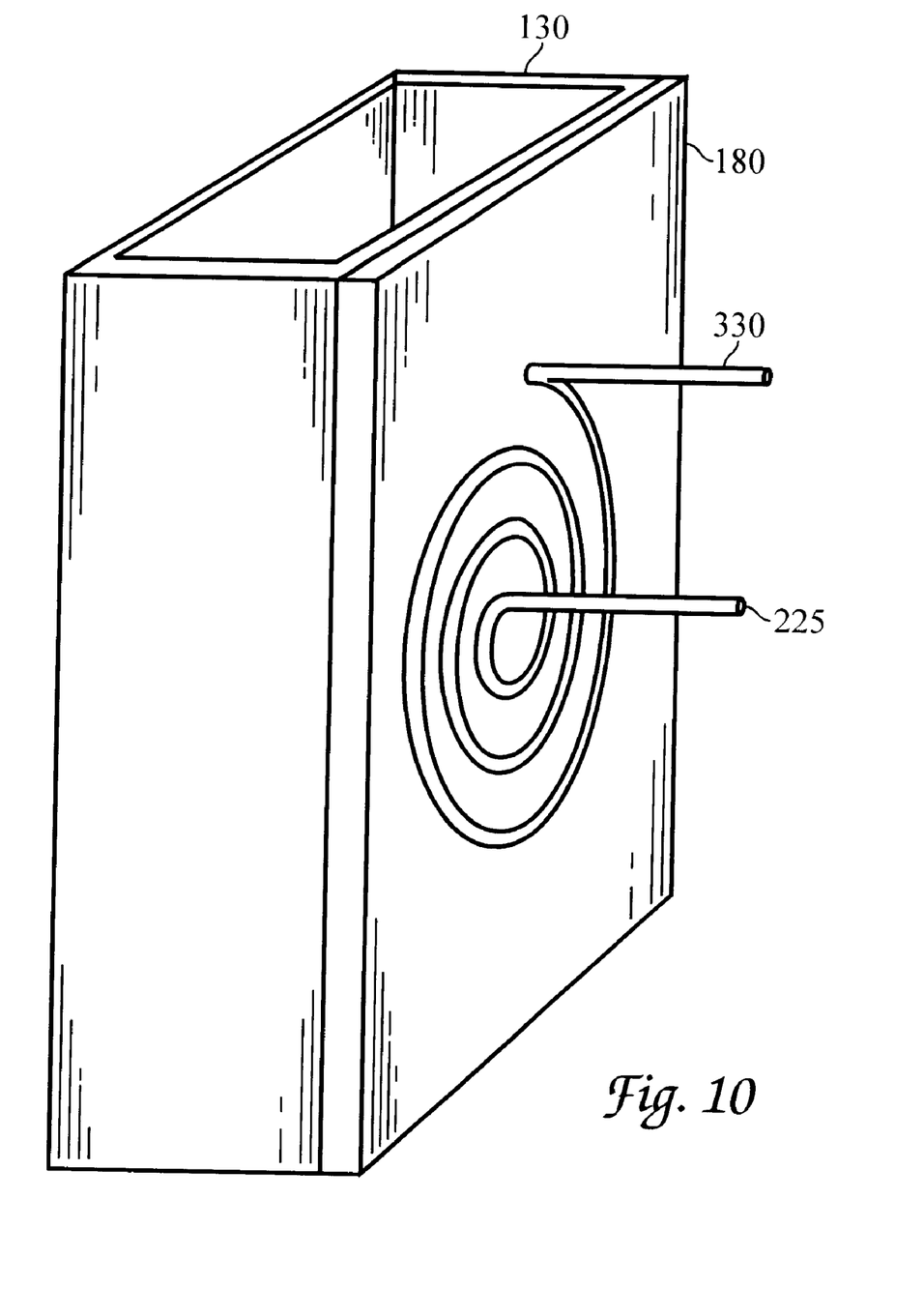
FIG. 10 is a schematic sectional perspective view of a chamber having a gas energizer comprising a flat inductor coil.
Figure 11A:
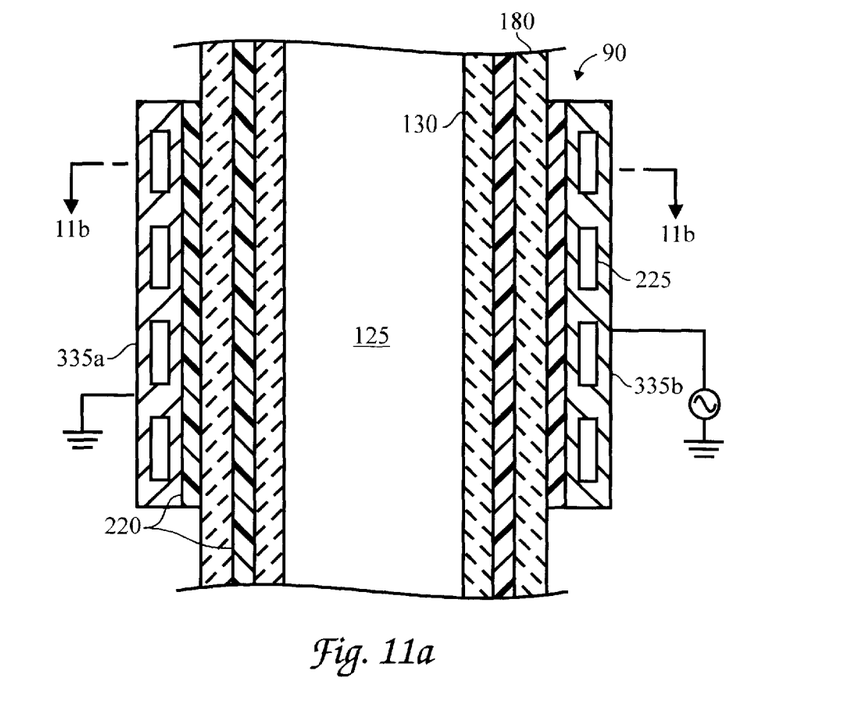
FIG. 11a is a schematic side view of the conduit of comprising another version of a gas energizer.
Figure 11B:
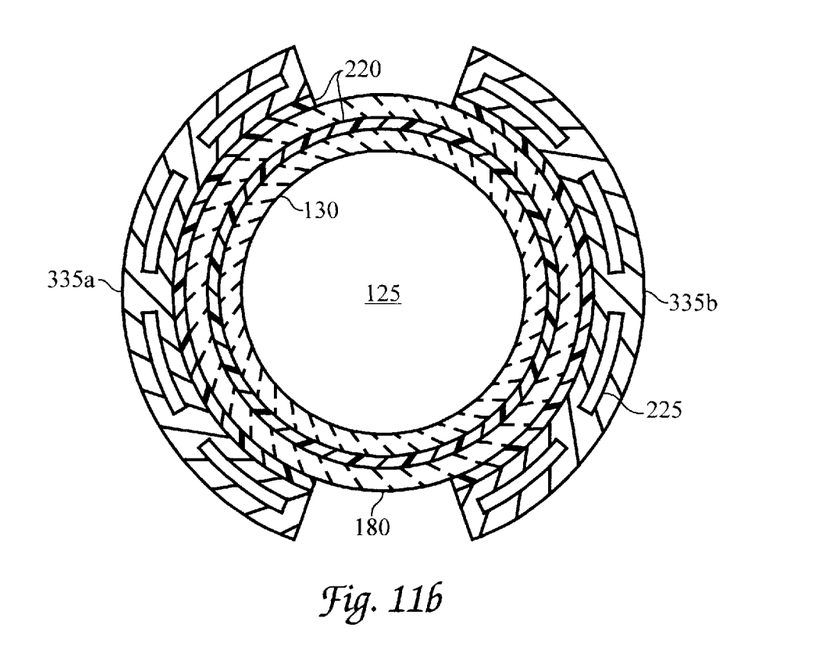

Alternative versions of the energy applicator 145 to couple RF energy to the gas in the conduit 130 are shown in FIG. 9. The energy applicator 145 comprises one or more inductor coils 330 that serve as a source of electromagnetic RF energy that is inductively coupled to the gas in the remote zone 125. The inductor coil 330 can comprise a continuous helical coil having a central axis parallel to the conduit 130. The inductor coil 330 abuts the conduit 130 to increase the strength of the inductive field in the remote zone 125. In another version shown in FIG. 10, the inductor coil 330 comprises a planar spiral coil abutting a flat window 95 of a conduit 130. This embodiment enhances the strength of the resultant inductive electric field in the remote zone 125 immediately adjacent to the window 95 resulting in a highly energetic plasma which cleans off reaction byproducts and etching residue deposited on the wall of the chamber 35. In yet another version, shown in FIGS. 11a and 11b, the energy applicator 145 comprises a pair of process electrodes 335a, 335b that are positioned within or adjacent to the conduit 130 that serves as a source of electromagnetic energy or waves that capacitively couples RF energy to the gas. The coils 330 or process electrodes 335a, 335b can also comprise channels 225 through which a high resistivity heat transfer fluid is circulated to serve as the heat sink 185.

Figure 12:
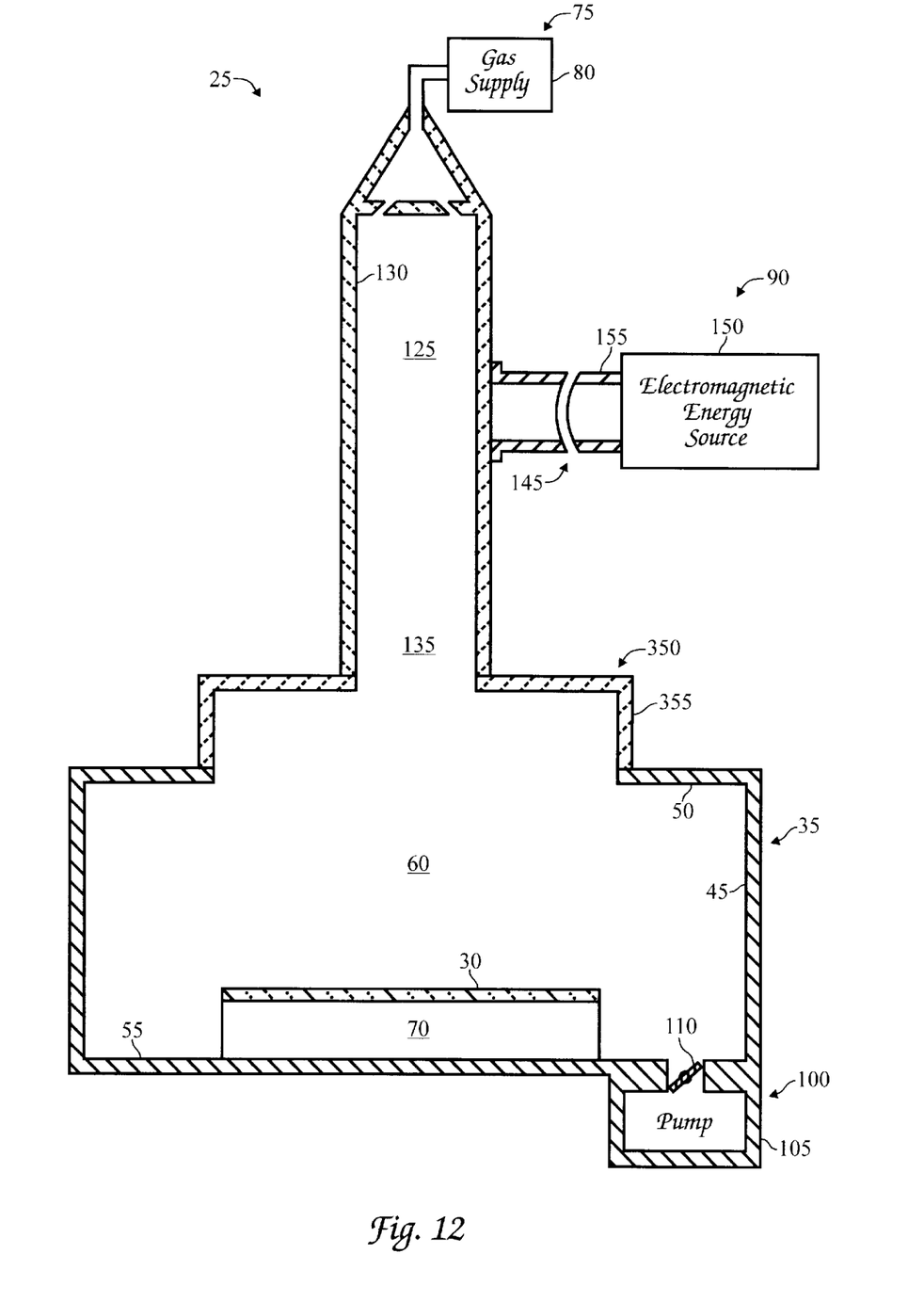
FIG. 12 is a schematic sectional view of a chamber comprising a gas expansion chamber.

In another aspect of the present invention, as shown in FIG. 12, the conduit 130 terminates in a gas expansion chamber 350 to reduce the collision frequency of energized gas species before they enter the process zone 60 of the chamber 35. The gas expansion chamber 350 comprises walls 355 that are farther apart than the walls 175 of the conduit 130, but less far apart than the sidewalls 45 of the chamber 35. Preferably, the gas expansion chamber 350 has a cross-sectional area that is larger than a cross-sectional area of the conduit 130 and smaller than a cross-sectional area of the chamber 35. More preferably, the gas expansion chamber 350 comprises a cross-sectional area that is from about 50 to about 500% larger than the cross-sectional area of the conduit 130. It has been discovered that these differences in cross-sectional area allow the charged plasma species and neutrals or dissociated species of the energized gas to disperse before their introduction into the process zone 60 of the chamber 35, thereby reducing the loss of reactivity of the energized gas arising from recombination of these species.

Preferably, the gas expansion chamber 350 comprises a shallow box having a rectangular or polygonal cross-section. The gas expansion chamber 350 is made of a material which is able to resist erosion by the energized gas and to withstand the mechanical and thermal stresses of the processing environment. When the conduit 130 is made of sapphire, the gas expansion chamber 350 is also made of sapphire, and the gas expansion chamber 350 is diffusion bonded, as described above, to the conduit 130. The diffusion bond forms a vacuum-tight seal that eliminates the need for an O-ring seal that would otherwise erode and produce contaminating particles or otherwise create vacuum leaks or other gas leaks.

While the present invention has been described in considerable detail with reference to certain preferred versions, many other versions should be apparent to those of ordinary skill in the art. For example, the window can comprise materials equivalent to boron nitride. As another example, the thermal conductor can abut a ceiling of the process chamber through which electromagnetic energy is coupled, and the heat dissipating assembly can be used to remove heat from the ceiling. Therefore, the spirit and scope of the appended claims should not be limited to the description of the preferred versions contained herein.

What is claimed is:

1. A chamber capable of processing a substrate, the chamber comprising:
   (a) a gas distributor having an aperture through which gas may be introduced into the chamber;
   (b) a wall comprising a window that allows microwave energy to pass through and a thermal conductor having first and second portions, the first portion contacting the window and being in the path of the microwave energy, and the thermal conductor comprising boron nitride or aluminum nitride;
   (c) a gas energizer capable of passing microwave energy through the window and thermal conductor of the wall to energize the gas in the chamber; and
   (d) a heat sink adapted to remove heat from the window, the heat sink contacting the second portion of the thermal conductor, and the heat sink being substantially out of the path of the microwave energy passed through the window and the thermal conductor.

2. A chamber according to claim 1 wherein the boron nitride comprises a thermal conductivity of at least about 80 W/mK.

3. A chamber according to claim 1 wherein the thermal conductor is sufficiently thin to provide a dissipation factor for absorbing RF or microwave energy of less than about 10%.

4. A chamber according to claim 1 wherein the thermal conductor is bonded to the window.

5. A chamber according to claim 4 wherein the thermal conductor is bonded by a compliant layer.

6. A chamber according to claim 5 wherein the compliant layer comprises thermally conducting particles in a polymer matrix.

7. A chamber according to claim 1 wherein the heat sink comprises channels through which heat transfer fluid is circulated.

8. A chamber according to claim 1 wherein the heat sink is electrically grounded.

9. A chamber according to claim 1 further comprising a magnetic field generator adapted to provide a magnetic field across a portion of the wall.

10. A chamber according to claim 1 wherein a portion of the wall forms a conduit, and wherein the aperture in the gas distributor is oriented to direct a stream of gas against a surface of the conduit.

11. A chamber according to claim 1 wherein the boron nitride comprises anisotropic thermal conductivity.

12. A chamber according to claim 1 further comprising (e) a support to support the substrate, and (f) an exhaust to exhaust the gas from the chamber.

13. A chamber according to claim 1 wherein the heat sink abuts substantially only one or more of the ends of the thermal conductor.

14. A chamber capable of processing a substrate, the chamber comprising:
   (a) a gas distributor having an aperture through which gas may be introduced into the chamber;
   (b) a wall comprising:
      (i) a window that allows microwave energy to pass through, and
      (ii) a thermal conductor comprising boron nitride or aluminum nitride and having first and second portions, at least the first portion bonded to the window and in the path of the microwave energy, and the first portion of the thermal conductor having (1) a dissipation factor for absorbing RF or microwave energy of less than about 10%, (2) an anisotropic thermal conductivity, and (3) a thermal conductivity in one direction of at least about 80 W/mK;
   (c) a gas energizer capable of passing microwave energy through the window and thermal conductor to energize the gas in the chamber; and
   (d) a heat sink adapted to remove heat from the thermal conductor, the heat sink being substantially out of the path of the microwave energy and bonded to the second portion of the thermal conductor.

15. A chamber according to claim 14 wherein the thermal conductor is bonded to the window by a compliant layer comprising thermally conducting particles in a polymer matrix.

16. A chamber according to claim 14 wherein the thermal conductor comprises boron nitride.

17. A chamber according to claim 14 wherein the heat sink is electrically grounded.

18. A chamber according to claim 14 further comprising a magnetic field generator adapted to provide a magnetic field across a portion of the wall.

19. A chamber according to claim 14 wherein a portion of the wall forms a conduit, and wherein the aperture in the gas distributor is oriented to direct a stream of gas against a surface of the conduit.

20. A chamber according to claim 14 further comprising (e) a support to support the substrate, and (f) an exhaust to exhaust the gas from the chamber.

* * * * *